United States Patent
Inoue et al.

(10) Patent No.: US 6,429,570 B1
(45) Date of Patent: Aug. 6, 2002

(54) SURFACE ACOUSTIC WAVE DEVICE

(75) Inventors: Kenji Inoue; Katsuo Sato; Hiroki Morikoshi; Katsumi Kawasaki; Kiyoshi Uchida, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/640,492

(22) Filed: Aug. 16, 2000

(30) Foreign Application Priority Data

Aug. 20, 1999 (JP) .......................................... 11-234744

(51) Int. Cl.$^7$ .............................................. H01L 41/08
(52) U.S. Cl. .................................................. 310/313 A
(58) Field of Search ........................ 310/313 R, 313 A; 333/150–155, 193–196

(56) References Cited

U.S. PATENT DOCUMENTS

| | | | | |
|---|---|---|---|---|
| 6,005,325 A | * | 12/1999 | Inoue et al. | 310/313 A |
| 6,084,333 A | * | 7/2000 | Inoue et al. | 310/313 A |
| 6,137,207 A | * | 10/2000 | Inoue et al. | 310/313 A |
| 6,140,738 A | * | 10/2000 | Inoue et al. | 310/313 A |
| 6,153,961 A | * | 11/2000 | Jian et al. | 310/313 A |
| 6,246,149 B1 | * | 6/2001 | Inoue et al. | 310/313 A |

FOREIGN PATENT DOCUMENTS

| | | |
|---|---|---|
| EP | 0 869 609 A1 | 10/1999 |
| JP | 10-284981 | 10/1998 |
| JP | 10-284982 | 10/1998 |
| JP | 10-284983 | 10/1998 |
| WO | WO 98/18204 | 4/1998 |
| WO | WO 99/12257 | 11/1999 |
| WO | WO 00/16478 | 3/2000 |

OTHER PUBLICATIONS

Smythe, R.C. "Material and Resonator Properties of Langasite and Langatate: A Progress Report," 1998 IEEE International Frequency Control Sumposium, pp. 761–765, Orlando Florida.

Shimizu, Yasutaka, "The Characteristics of SAW Materials and the Present Status in Japanese Industries," the Transactions of The Institute of Electronics, Information and Communication Engieers A, vol. J76–A, No. 2, pp. 129–137 (1993).

Extended Abstracts (The 44th Spring Meeting, 1997); The Japan Society of Applied Physics and Related Societies.

(List continued on next page.)

*Primary Examiner*—Mark Budd
(74) *Attorney, Agent, or Firm*—Brown Raysman Millstein Felder & Steiner, LLP

(57) ABSTRACT

A surface acoustic wave device includes a substrate and an inter-digital electrode on a surface of the substrate, wherein the substrate is formed by cutting out of a single crystal represented by a chemical formula, $La\alpha Ta\beta Ga\gamma O\delta$ ($2.9 \leq \alpha \leq 3.1$, $0.48 \leq \beta \leq 0.52$, $5.4 \leq \gamma \leq 5.6$ and $8 \leq \delta \leq 14$); a cut angle of the substrate cut out of the single crystal and a direction of propagation of surface acoustic waves on the substrate represented in terms of Euler's angles ($\phi$, $\theta$, $\psi$), $\phi$, $\theta$ and $\psi$ are found in one of a first area represented by $-5$ degrees $\leq \phi \leq -5$ degrees, $135$ degrees $\leq \theta \leq 150$ degrees and $20$ degrees $< \psi < 25$ degrees, and a second area represented by $-5$ degrees $\leq \phi \leq -5$ degrees, $135$ degrees $\leq \theta \leq 150$ degrees and $-25$ degrees $\leq \psi \leq -20$ degrees, respectively; and a normalized thickness $h/\lambda$ obtained by normalizing a thickness h of the inter-digital electrode finger with a wavelength of the surface acoustic wave exceeds 0.5% and is equal to or smaller than 4%. The thus constituted surface acoustic wave device enables miniaturization, band-widening and excellent selectivity, namely, superior temperature characteristics.

32 Claims, 3 Drawing Sheets

OTHER PUBLICATIONS

U.S. application No. 09/091,264, Inoue et al., filed Jul. 17, 1998.
U.S. application No. 09/303,537, Inoue et al., filed May 3, 1999.
U.S. application No. 09/394,718, Inoue et al., filed Sep. 13, 1999.
U.S. application No. 09/395,103, Inoue et al., filed Sep. 14, 1999.
U.S. application No. 09/420,938, Inoue et al., filed Oct. 19, 1999.

* cited by examiner

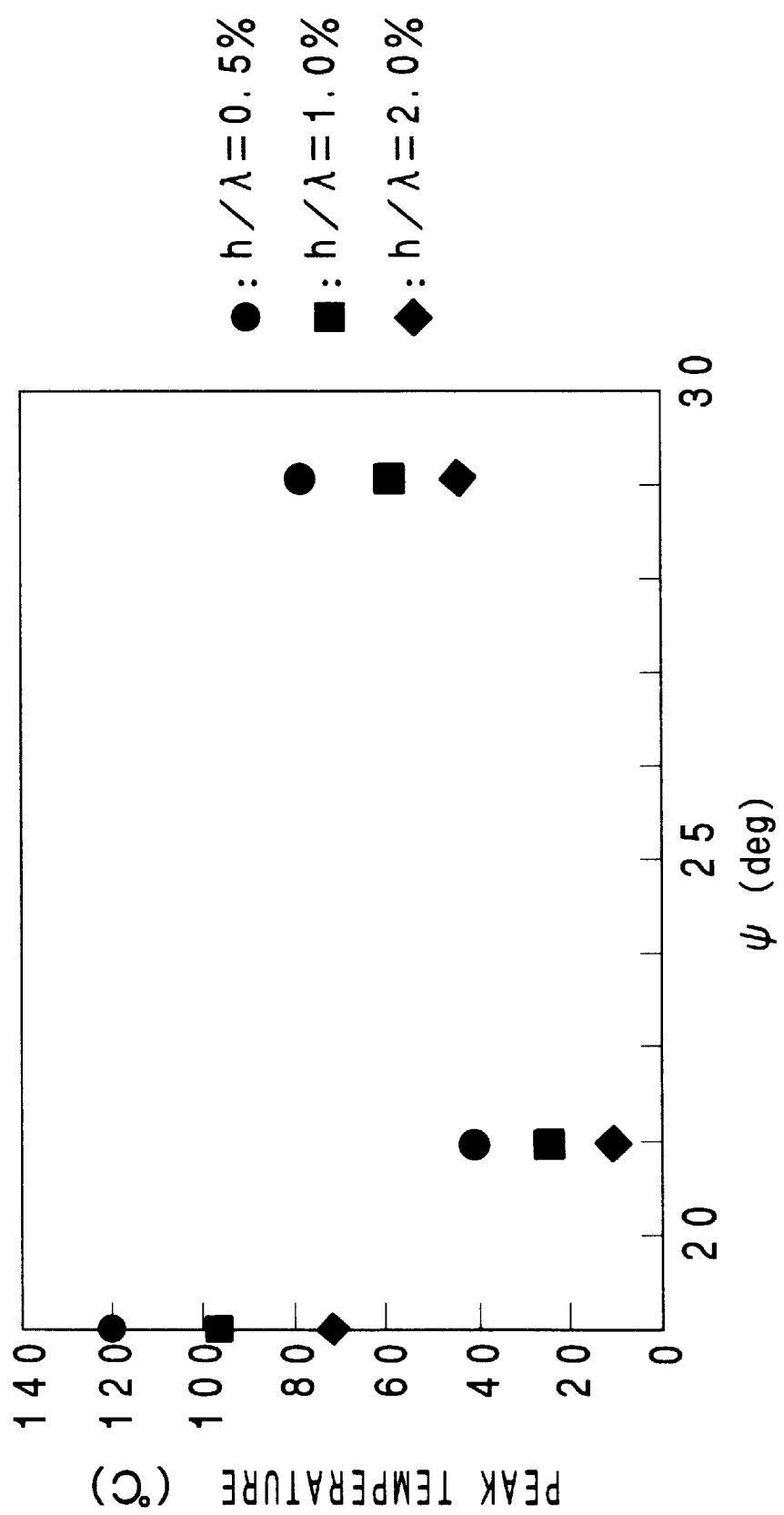

SURFACE ACOUSTIC WAVE DEVICE

BACKGROUND OF THE INVENTION

The present invention relates to a surface acoustic wave device having an inter-digital electrode on a single crystal substrate, and, in particular, such a device enabling miniaturization, band-widening and excellent selectivity, namely, superior temperature characteristics.

DESCRIPTION OF THE PRIOR ART

In recent years, various kinds of mobile communication terminal, devices inclusive of cellular telephones, have come into widespead use. It is highly desirable to reduce this kind of terminal equipment in size and weight for enhanced portability.

In order to reduce the size and weight of terminal devices, their electronic parts must be substantially reduced in size and weight. For this reason, surface acoustic wave devices enabling size and weight reduction, namely, surface acoustic wave filters, are often used for high- and intermediate-frequency parts of terminal devices. Such devices are formed with an inter-digital electrode for exciting, receiving, reflecting and propagating surface acoustic waves on the surface of a piezoelectric substrate thereof.

Among characteristics important to a piezoelectric substrate used for surface acoustic wave devices are surface wave velocity (SAW velocity), temperature coefficient of center frequency in the case of filters or of resonant frequency in the case of resonators (the temperature coefficient of frequency: TCF), and electromechanical coupling factor ($k^2$). The characteristics of typical piezoelectric substrates currently known for surface acoustic wave devices are set forth below in Table 1. For details regarding these characteristics, reference should be made to Yasutaka SHIMIZU, "Propagation characteristics of SAW materials and their current application", the Transactions of The Institute of Electronics, Information and Communication Engineers A, Vol. J76-A, No.2, pp. 129–137 (1993). Hereinafter, the piezoelectric substrates for surface acoustic wave devices are referred to using the designations in Table 1.

electric substrate used and almost inversely proportional to the width of electrode fingers formed on the substrate. To enable such filters to be operated at high frequencies, therefore, it is preferable to utilize substrates having high SAW velocities, for instance, 64LN and 36LT.

Also, a wide passband width of 20 MHz or more is required for filters used as high-frequency parts. To achieve such wide passband, however, it is essential for the piezoelectric substrate to have a large electromechanical coupling factor $k^2$. For these reasons, much use is made of 64LN and 36LT.

On the other hand, mobile communication terminal devices use an intermediate frequency in the 70 to 300 MHz band. When a filter having a center frequency in this frequency band is constructed using a surface acoustic wave device, if the aforementioned 64LN or 36 LT is used as the piezoelectric substrate, the widths of the electrode fingers formed on the substrate have to be much larger than those of the aforementioned filter used as a high-frequency part.

More specifically, the following equation (1) roughly applies to the relationship among the width d of an electrode finger of a surface acoustic wave transducer that forms a surface acoustic wave filter, the center frequency $f_0$ of the surface acoustic wave filter, and the SAW velocity V of the piezoelectric substrate used.

$$f_0 = V/(4d) \tag{1}$$

If a surface acoustic wave filter having a center frequency of 1 GHz is constructed on the assumption that the SAW velocity is 4000 m/s, the width of the electrode finger thereof is calculated from the equation (1) to be $$d = 4000(m/s)/(4 \times 1000(MHz)) = 1 \ \mu m$$

On the other hand, when an intermediate-frequency filter having a center frequency of 100 MHz is constructed using this piezoelectric substrate having an SAW velocity of 4000 m/s, the width of the electrode finger required for this is given by $$d = 4000(m/s)/(4 \times 100(MHz)) = 10 \ \mu m$$

Thus, the required width of the electrode finger is ten times as large as that for the high-frequency part filter. A

TABLE 1

| Symbol | Composition | Cut Angle | Propagation Direction | SAW Velocity (m/s) | $k^2$(%) | TCF (ppm/° C.) |
|---|---|---|---|---|---|---|
| 128LN | LiNbO$_3$ | 128° -Rotated Y | X | 3880~3920 | 5.6 | −74 |
| 64LN | LiNbO$_3$ | 64° -Rotated Y | X | 4330~4360 | 11 | −79 |
| LT112 | LiTaO$_3$ | X | 112° -Rotated Y | 3220~3260 | 0.72 | −18 |
| 36LT | LiTaO$_3$ | 36° -Rotated Y | X | 4100~4160 | 5.0 | −45 |
| ST Quartz Crystal | Quartz Crystal | ST | X | 3130~3155 | 0.17 | 0 (first-order coeff.) |
| BGO | Bi$_{12}$GeO$_{20}$ | (100) | (011) | 1681~1720 | 1.2 | −122 |

As can be seen from Table 1, 64LN and 36LT have an SAW velocity of 4000 m/s or higher, and as described later, 64LN and 36LT are suitable to construct filters for high-frequency parts of mobile communication terminal devices.

Various systems are practically employed all over the world for mobile communications devices, typically cellular telephones, and are all used at frequencies of the order of 1 GHz. Therefore, filters used for high-frequency parts of terminal devices have a center frequency of approximately 1 GHz. A surface acoustic wave filter has a center frequency substantially proportional to the SAW velocity of the piezolarge width of the electrode finger means that the surface acoustic wave intermediate-frequency filter itself becomes large. Therefore, in order to make a surface acoustic wave intermediate-frequency filter small, it is necessary to use a piezoelectric substrate having a low SAW velocity V as can be appreciated from the equation (1).

BGO referred to in Table 1 is known as a piezoelectric substrate having a very low SAW velocity. However, since the temperature coefficient of frequency TCF of a BGO piezoelectric substrate is extremely large, the BGO piezoelectric substrate is not suitable for constructing an intermediate-frequency filter for extracting one channel signal alone. This is because a large TCF value means that the center frequency of the surface acoustic wave filter varies greatly with temperature. Thus, a large TCF is unsuitable for an intermediate-frequency filter because undesired signals may possibly be extracted from another channel adjacent to the desired channel.

As described above, one problem with the conventional surface acoustic wave device is that in the case where a piezoelectric substrate having a large electromechanical coupling factor such as 64LN and 36LT is used, it is possible to make the passband thereof wide but the device size becomes large since the substrate has a high SAW velocity. Another problem is that when the aforementioned BGO substrate having a low SAW velocity is used to achieve device size reduction, sufficient selectivity cannot be obtained because the absolute value of temperature coefficient of frequency TCF is too large. In either case, characteristics sufficient for any intermediate-frequency surface wave acoustic filter cannot be achieved.

On the other hand, ST quartz crystal referred to in Table 1 is known as a piezoelectric substrate having a relatively low SAW velocity. Although the effective SAW velocity of a piezoelectric substrate is influenced by the structure of the electrode finger formed on the substrate, it is known that the SAW velocity of ST quartz crystal is generally 3130 to 3155 m/s and since this value is approximately three-fourths the SAW velocity of 64LN or 36 LT, ST quartz crystal is suitable for miniaturization.

In view of these facts, most conventional intermediate-frequency surface acoustic wave devices for mobile communication terminal devices are constructed using an ST quartz crystal piezoelectric substrate.

However, as apparent from Table 1, the electromechanical coupling factor $k^2$ of ST quartz crystal is 0.17%, particularly small among piezoelectric substrates. Small $k^2$ means that only a filter having a narrow passband is achievable.

Nevertheless, main devices adopted so far for mobile communication, namely, cellular telephones, are analog systems with a very narrow channel width of, for instance, 12.5 kHz according to the Japanese NTT standard, 30 kHz according to the U.S. AMPS standard and 25 kHz according to the European TACS standard. Thus, the fact that the aforementioned ST quartz crystal has a small electromechanical coupling factor $k^2$ has caused no problem whatsoever.

In recent years, however, digital mobile communication systems have been developed and put into practical use. These systems have won very rapid acceptance because of their ability to make effective use of frequency resources, compatibility with digital data communications, and so on. The channel width of this digital mobile communication system is very wide, for instance, 200 kHz in the European cellular telephone GSM and 1.7 MHz in the European cordless telephone DECT modes. It is difficult to construct an intermediate-frequency filter having the wide band required in the digital mobile communication system when an ST quartz crystal substrate having a small electromechanical coupling factor $k^2$ is used for the surface acoustic wave filter.

Further, when an ST quartz crystal substrate is used for a surface acoustic wave filter, it is not only difficult to construct a wide-band intermediate-frequency filter because of the small electromechanical coupling factor thereof but also difficult to make the surface acoustic wave filter small since the SAW velocity thereof, though relatively small, is not small enough.

SUMMARY OF THE INVENTION

It is therefore an object of the present invention to provide a surface acoustic wave device enabling miniaturization, band-widening and excellent selectivity, namely, superior temperature characteristics.

The above and other objects of the present invention can be accomplished by a surface acoustic wave device comprising a substrate and an inter-digital electrode on a surface of the substrate, wherein the substrate is formed by cutting out of a single crystal represented by a chemical formula, $La_\alpha Ta_\beta Ga_\gamma O_\delta$ ($2.9 \leq \alpha \leq 3.1$, $0.48 \leq \beta \leq 0.52$, $5.4 \leq \gamma \leq 5.6$ and $13.8 \leq \delta \gamma \leq 14.2$), a cut angle of the substrate cut out of the single crystal and a direction of propagation of surface acoustic waves on the substrate represented in terms of Euler's angles ($\phi$, $\theta$, $\psi$), $\phi$, $\theta$ and $\psi$ are found in one of a first area represented by $-5$ degrees $\leq \phi \leq 5$ degrees, 135 degrees $\leq \theta \leq 150$ degrees and 20 degrees $< \psi <$ 25 degrees and a second area represented by $-5$ degrees $\leq \phi \leq 5$ degrees, 135 degrees $\leq \theta \leq 150$ degrees and $-25$ degrees $< \psi < -20$ degrees, respectively, and a normalized thickness $h/\lambda$ obtained by normalizing a thickness $h$ of the inter-digital electrode finger with a wavelength of the surface acoustic wave exceeds 0.5% and is equal to or smaller than 4%.

The present invention is based on the experimentally acquired knowledge that when a single crystal represented by the chemical formula, $La_\alpha Ta_\beta Ga_\gamma O_\delta$ ($2.9 \leq \alpha \leq 3.1$, $0.48 \leq \beta \leq 0.52$, $5.4 \leq \gamma \leq 5.6$ and $13.8 \leq \delta \leq 14.2$) (hereinafter referred to as "an LTG single crystal") has a specifically combined cut angle and direction of propagation of surface acoustic waves such that when represented by $\phi$, $\theta$, and $\psi$ in terms of Euler's angles ($\phi$, $\theta$, $\psi$), they are present within the first area or the second area, the temperature dependence of the center frequency of a filter comprising the single crystal or that of the resonant frequency of a resonator filter comprising the single crystal can be approximated by a quadratic curve, and such properties as expressed in terms of an SAW velocity of less than 3000 m/s and an electromechanical coupling factor of greater than 0.4% can be obtained.

The present invention is further based on the experimentally acquired knowledge that when the LTG single crystal has a specifically combined cut angle and direction of propagation of surface acoustic waves such that when represented by $\phi$, $\theta$, and $\psi$ in terms of Euler's angles ($\phi$, $\theta$, $\psi$), they are present within the first area or the second area, the temperature corresponding to the peak of the quadratic curve, namely, the temperature at which the change of the center frequency or the resonant frequency is minimized, closely correlates with the normalized thickness $h/\lambda$ of the inter-digital electrode finger (wherein $h$ is the thickness of the inter-digital electrode finger and $\lambda$ is the wavelength of the surface acoustic wave at the center frequency or the resonant frequency) and that it is necessary to determine the normalized thickness $h/\lambda$ so as to exceed 0.5% and be equal to or less than 4% in order to set the temperature corresponding to the peak of the quadratic curve in the vicinity of room temperature and achieve a surface acoustic wave device which shows an excellent temperature stability at an ambient temperature at which it is normally used.

In the present invention, $\phi$ in the first area preferably ranges from 20.5 degrees to 23.5 degrees.

In the present invention, $\phi$ in the second area preferably ranges from $-23.5$ degrees to $-20.5$ degrees.

In the present invention, the normalized thickness $h/\lambda$ preferably ranges from 0.7% to 2%.

The LTG single crystal used in the present invention is generally represented by the chemical formula, $La_\alpha Ta_\beta Ga_\gamma O_\delta$ ($2.9 \leq \alpha \leq 3.1$, $0.48 \leq \beta \leq 0.52$, $5.4 \leq \gamma \leq 5.6$ and $13.8 \leq \gamma\delta 14.2$) and is known as a substituted cryst of a well-known langasite single crystal ($La_3Ga_5SiO_{14}$) (Extended Abstracts (The 44th Spring Meeting, 1997); The Japan Society of Applied Physics and Related Societies).

The present invention is intended to achieve a surface acoustic wave device having excellent characteristics by employing an LTG single crystal as the substrate of the surface acoustic wave device, selecting the cut angle of the crystal and the direction of propagation of surface acoustic waves within a specific range and selecting the normalized thickness of the inter-digital electrode finger within a specific range.

In the present invention, if manufacturing errors are not considered, the LTG crystal most preferably has such a composition that α is equal to 3, β is equal to 0.5, γ is equal to 5.5 and δ is equal to 14, namely, $La_3Ta_{0.5}Ga_{5.5}O_{14}$. If manufacturing errors are considered, the composition ratios between the respective elements may be slightly varied within the range of $2.9 \leq \alpha \leq 3.1$, $0.48 \leq \beta \leq 0.52$, $5.4 \leq \gamma \leq 5.6$ and $13.8 \leq \delta \leq 14.2$ insofar as the technical advantages of the present invention are not deteriorated. Further, the LTG single crystal may contain unavoidable impurities such as Al, Zr, Fe, Ce, Nd, Pt and Ca. The method of manufacturing an LTG single crystal is not particularly limited and an ordinary crystal growing process such as the CZ process can be employed for manufacturing the LTG single crystal.

It is to be noted that the LTG single crystal is a trigonal system, and so mutually equivalent combinations of Euler's angles exist due to crystal symmetry. In the trigonal system substrate, $\phi=120$ degrees to 240 degrees and $\phi=240$ degrees to 360 degrees (−120 degrees to 0 degree) are equivalent to $\phi=0$ degree to 120 degrees; $\theta=360$ degrees to 180 degrees (0 degree to −180 degrees) is equivalent to $\theta=0$ degree to 180 degrees; and $\psi=270$ degrees to 90 degrees is equivalent to $\psi=-90$ degrees to 90 degrees. For example, $\phi=130$ degrees and $\phi=250$ degrees are equivalent to $\phi=10$ degrees; $\theta=330$ degrees is equivalent to $\theta=30$ degrees; and $\psi=240$ degrees is equivalent to $\psi=60$ degrees.

Further, in the trigonal system substrate, the characteristics thereof at all cut angles and in all propagation directions can be learned by determining characteristics thereof in the range from 0 degree to 30 degrees.

Therefore, in order to learn the characteristics thereof at all cut angles and in all propagation directions, it is sufficient to study the characteristics thereof only in the range of $\phi 0=0$ degree to 30 degrees, $\theta 0=0$ degree to 180 degrees and $\psi 0=-90$ degrees to 90 degrees. Based on the combination ($\phi 0$, $\theta 0$, $\psi 0$) an equivalent combination exhibiting the same characteristics in the range of $\phi=30$ degree to 120 degrees can be learned. Concretely, in the range of 30 degrees $\leq \phi \leq 60$ degrees, ($\phi$, $\theta$, $\psi$) equivalent to ($\phi 0$, $\theta 0$, $\psi 0$) can be obtained by $\phi=60$ degrees $-\phi 0$, $\theta=180$ degrees $-\theta 0$ and $\psi=\psi 0$ in the range of 30 degrees $\leq \phi \leq 60$ degrees, ($\phi$, $\theta$, $\psi$) equivalent to $\phi 0$, $\theta 0$, $\psi 0$) can be obtained by $\phi=60$ degrees $+\phi 0$, $\theta=180$ degrees $-\theta 0$ and $\psi=-\psi 0$; and in the range of 90 degrees $\leq \phi \leq 120$ degrees, ($\phi$, $\theta$, $\psi$) equivalent to ($\phi 0$, $\theta 0$, $\psi 0$) can be obtained by $\phi=120$ degrees $-\phi 0$, $\theta=\theta 0$ and $\psi=-\psi 0$. As a result, based on the aforementioned symmetrical property, the characteristics of the LTG single crystal substrate for all ($\phi$, $\theta$, $\psi$) can be learned.

Set out below are exemplary equivalent combinations.

Equivalent to (0 degree, 140 degrees, 25 degrees) are (60 degrees, 40 degrees, 25 degrees), (60 degrees, 40 degrees, −25 degrees) and (120 degrees, 140 degrees, −25 degrees) and since $\phi=120$ degrees is equivalent to $\phi=0$ degree, (0 degree, 140 degrees, −25 degrees) is also equivalent to (0 degree, 140 degrees, 25 degrees).

The first area and the second area include all combinations of equivalent ($\phi$, $\theta$, $\psi$) obtained in the above described manner.

It is to be noted that the wavelength λ of a surface acoustic wave is determined by the frequency to which the surface acoustic wave device is applied and the speed of sound of the substrate. In the preferred frequency band to which the present invention is applied the wavelength λ is generally 8 to 60 μm.

In general, the surface acoustic wave device according to the present invention lends itself well to filters used in the frequency band of 10 to 300 MHz.

Further, the surface acoustic wave device according to the present invention is also useful for making a surface acoustic wave delay element small, because of the low SAW velocity thereof.

BRIEF DESCRIPTION OF THE DRAWINGS

FIG. 3 is a graph showing the relationship between the peak temperature of the temperature dependence curve of the center frequency shown in FIG. 2, a normalized thickness h/λ and an angle ψ.

DESCRIPTION OF THE PREFERRED EMBODIMENT

Figure 1:
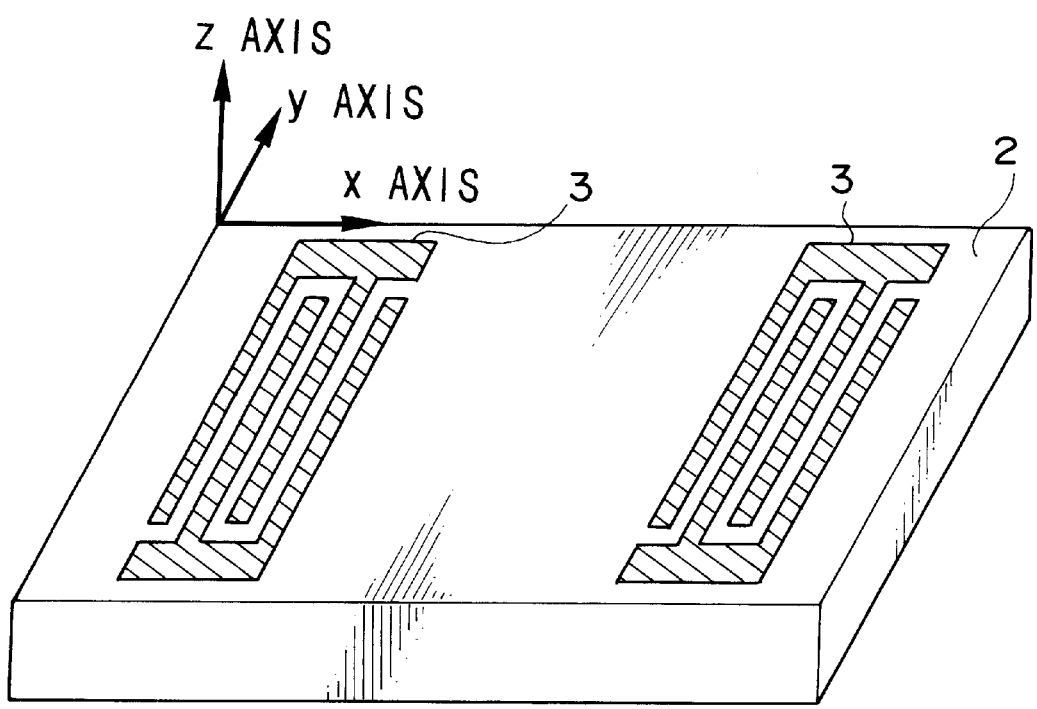
FIG. 1 is a schematic perspective view showing a surface acoustic wave device which is a preferred embodiment of the present invention.

As shown in FIG. 1, a surface acoustic wave device which is a preferred embodiment of the present invention includes a pair of inter-digital electrodes 3, 3 on the surface of a substrate 2. An LTG single crystal represented by the chemical formula, La3Ta0.5Ga5.5O14, is used as the substrate 2 and the LTG single crystal has a crystal form belonging to the point group 32.

The x, y and z axes shown in FIG. 1 are perpendicular to each other. The x axis and y axis lie in a plane including the surface of the substrate 2 and the x axis defines the direction of propagation of surface acoustic waves.

The size of the substrate is not limited but may generally be of the order of 4 to 10 mm in the direction of propagation of surface acoustic waves and of the order of 2 to 4 mm in the direction perpendicular thereto. The thickness of the substrate 2 may be of the order of 0.2 to 0.4 mm.

The inter-digital electrodes 3, 3 formed on the substrate 2 are thin layer electrodes for exciting, receiving, reflecting and propagating surface acoustic waves and are formed in a periodical stripe-like manner. The inter-digital electrodes are patterned so that the direction of propagation of surface acoustic waves coincides with the direction of the x axis. The inter-digital electrodes may be formed as by vacuum evaporation or sputtering, using Al or an Al alloy such as Al—Cu. The finger width of the inter-digital electrode may be appropriately determined depending on the frequency to which the surface acoustic wave device is applied and may generally be of the order of 2 to 10 mm at the frequency band to which the present invention is applied.

The z axis perpendicular to the surface of the substrate 2 defines the cut angle (cut plane) of the substrate 2 cut out of a single crystal. Relationships between the x axis, y axis and z axis and the X axis, Y axis and Z axis of the LTG single crystal may be represented in terms of Euler's angles ($\phi$, $\theta$, $\psi$).

When the cut angle and the direction of propagation are represented in terms of Euler's angles ($\phi$, $\theta$, $\psi$) in the surface acoustic wave device. according to the present invention, $\phi$, $\theta$ and $\psi$ are present in the following first area or second area.
First area:
  −5 degrees $\leq \phi \leq$ 5 degrees,
  135 degrees $\leq \theta \leq$ 150 degrees and
  20 degrees $< \psi <$ 25 degrees
Second area:
  −5 degrees $\leq \phi \leq$ 5 degrees,
  135 degrees $\leq \theta \leq$ 150 degrees and
  −25 degrees $< \psi <$ −20 degrees The preferable range of $\phi$ in the first area is 20.5 degrees to 23.5 degrees and the preferable range of $\phi$ is −23.5 degrees to −20.5 degrees.

In the first area and the second area, there is a combination of $\phi$, $\theta$ and $\psi$ wherein the electromechanical coupling factor $k^2$ of the substrate is sufficiently large or at least 0.4%.

The temperature dependence of the center frequency in the vicinity of room temperature can be made extremely small by selecting $\phi$, $\theta$ and $\psi$ from the first area or the second area and setting the normalized thickness h/$\lambda$ obtained by normalizing the thickness h of the inter-digital electrode with the wavelength $\lambda$ of a surface acoustic wave so as to exceed 0.5% and be equal to or smaller than 4%, preferably, to range from 0.7% to 2%.

Hereinafter, a working example is described in order to clarify the technical advantages of the present invention.

Working Example

An LTG single crystal represented by a chemical formula, La3Ta0.5Ga5.5O14 was grown by the CZ process and three substrates were cut out of the LTG single crystal.

A surface acoustic wave transducer including a pair of inter-digital electrodes was formed on each of the substrates, thereby producing three surface acoustic wave devices.

The inter-digital electrodes were formed on both output and input sides by vacuum evaporation of Al, and had an electrode finger width d of 15 $\mu$m and an electrode finger pitch (4d=$\lambda$) of 60 $\mu$m, with the number of electrode finger pairs being 20. The electrode thicknesses (normalized thicknesses h/$\lambda$ of the surface acoustic wave devices were 0.5%, 1% and 2%, respectively.

The cut angle of each of the substrates was (0 degree, 140 degrees, $\psi$) in terms of Euler's angles. This cut angle is a so-called single rotation where only one crystal rotation is needed for cutting, and is preferable.

Figure 2:
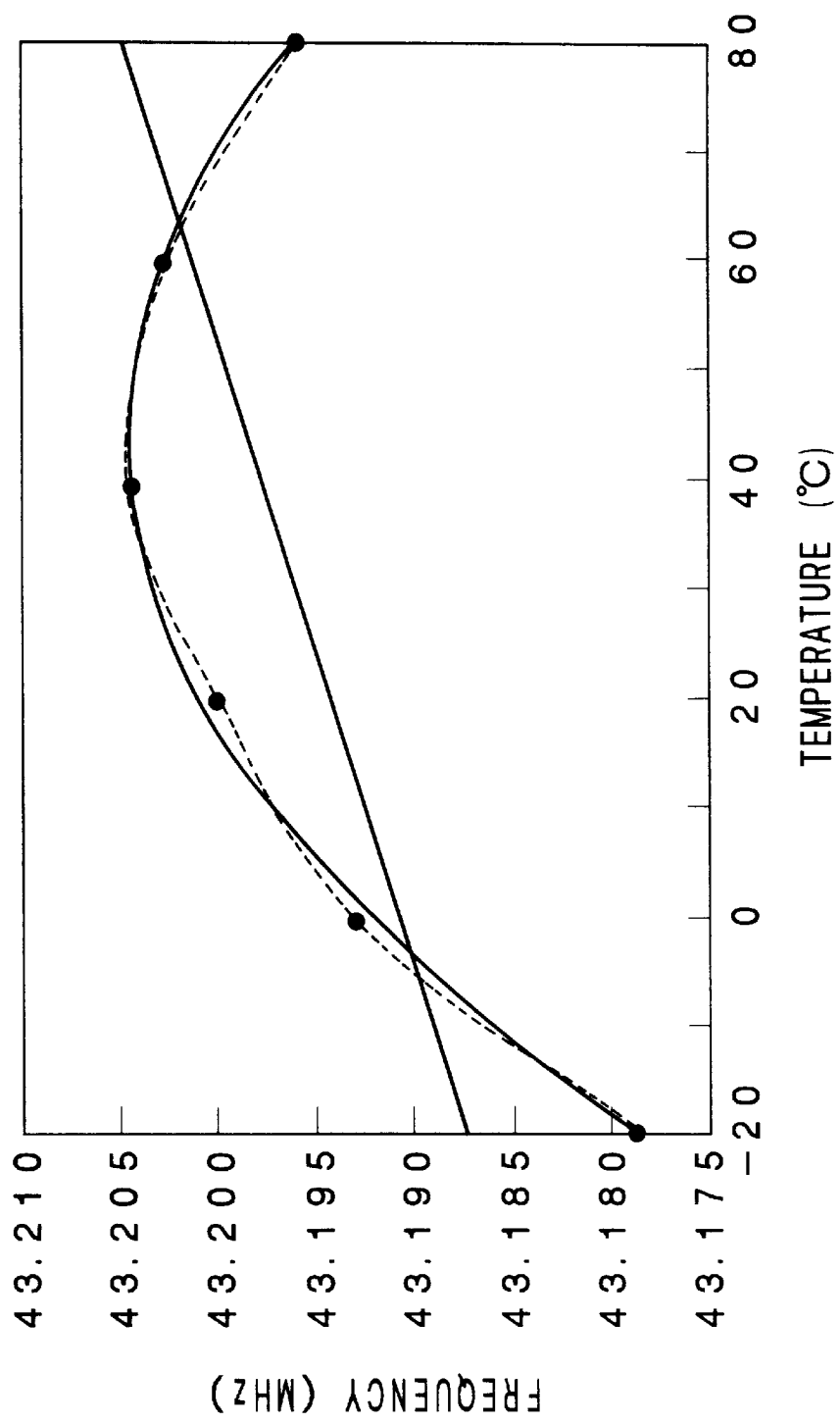
FIG. 2 is a graph showing the temperature dependence of center frequency in a surface acoustic wave device.

FIG. 2 is a graph showing the temperature dependence of the center frequency when $\phi$ and $\theta$ are present in the first area or the second area and $\psi$ is present in the vicinity of the first area in the thus produced surface acoustic wave device (surface acoustic wave filter) having the normalized thickness h/$\lambda$ of 2%. The temperature dependence of the center frequency was measured in the range of −20 to 80° C. and the thus measured values are plotted in FIG. 2.

Not only in the case where $\phi$, $\theta$ and $\psi$ were present in the first area or the second area but also in the case where $\phi$, $\theta$ and $\psi$ were present in the vicinity of the first area or the second area, it was found that the temperature dependence of the center frequency could be approximated by a quadratic curve.

The quadratic curve shown in FIG. 2 was obtained by approximating the measured values to a quadratic curve using the least squares method. In order to achieve a surface acoustic wave device having excellent temperature dependence, it is important for the temperature corresponding to the peak of the quadratic curve to be present in the vicinity of room temperature.

From FIG. 2, it can be seen that the temperature dependence of the center frequency can be well approximated by a quadratic curve. In this surface acoustic wave device, the temperature corresponding to the peak of the quadratic curve (hereinafter referred to as "the peak temperature") was 44.59° C.

The straight line shown in FIG. 2 was obtained by approximating values measured at −20 to 80° C. to a straight line using the least squares method. The temperature coefficient of frequency TCF obtained from this straight line was 4 ppm/°C.

In the thus produced surface acoustic wave devices, the temperature dependence of the center frequency was approximated by a quadratic curve to find the peak temperature of the quadratic curve, thereby investigating the relationship between the peak temperature, and the propagation direction $\psi$ at different normalized thicknesses h/$\lambda$. The results are plotted in FIG. 3.

FIG. 3 shows the relationship between the propagation direction $\psi$ and the peak temperature in the cases where the normalized thickness h/$\lambda$ was 0.5%, 1% and 2%. From FIG. 2, it can be seen that the peak temperature was lowest when the propagation direction $\psi$ was 22 degrees and the peak temperature was present in the vicinity of room temperature when the normalized thickness h/$\lambda$ was 1% or 2% in such a case.

In the case where $\psi$ deviates from the first area and the second area, it is possible to lower the peak temperature to some extent by increasing h/$\lambda$. However, when the actual thickness of an inter-digital electrode is too great, it takes a long time to form an electrode, thereby lowering productivity and the electrode tends to peel off. This is undesirable.

As described above, according to the present invention, since the peak temperature in the temperature dependence curve of the center frequency is present in the vicinity of room temperature, the surface acoustic wave device has excellent temperature dependence. Moreover, the device can be produced with high productivity and its electrodes be made resistant to peeling.

Further, in the thus produced surface acoustic wave device, when $\psi$ was 22 degrees, the SAW velocity was low (2574 m/s) and the electromechanical coupling factor $k^2$ was high (0.58%). From this, it can be seen that the present invention is advantageous for miniaturization and band-widening of a surface acoustic wave device. Here, the SAW velocity was obtained from the center frequency and the electromechanical coupling factor was obtained by measuring two-terminal admittance of surface acoustic wave conversion and using a well-known Smith's equivalent circuit based on the measured two-terminal admittance.

Further, in the surface acoustic wave devices exhibiting the peak temperature characteristics shown in FIG. 3, it was found that TCF at $\psi$=22 degrees was 1 ppm/°C. when h/$\lambda$=1%, −2 ppm/°C. when h/$\lambda$=2%, both small values and, therefore, the surface acoustic wave devices had excellent characteristics as surface acoustic wave filters for an intermediate frequency. To the contrary, it was found that TCF at $\psi$=20 degrees was 13 ppm/°C. when h/$\lambda$=1% and 9 ppm/°C. when h/$\lambda$=2% and that TCF at $\psi$=29 degrees was 9 ppm/°C. when h/$\lambda$=1% and 4 ppm/°C. when h/$\lambda$=2%. As these values were greater than those when $\psi$=22 degrees, the characteristics of the surface acoustic wave devices were insufficient for a surface acoustic wave filter for an intermediate frequency. As described above, these TCFs were obtained by approximating values measured at −20 to 80° C. to a straight line using the least squares method.

The present invention has thus been shown and described with reference to a specific embodiment and working examples. However, it should be noted that the present invention is in no way limited to the details of the described arrangements but changes and modifications may be made without departing from the scope of the appended claims.

For example, in the above-described embodiment and working examples, a substrate cut out of a single crystal represented by the chemical formula, $La_\alpha Ta_\beta Ga_\gamma O_\delta$ was used. Although a substrate cut out of a single crystal having such composition is preferably used in the present invention, if other factors such as manufacturing errors are considered, it is possible to employ a substrate cut out of a single crystal represented by the chemical formula, $La_\alpha Ta_\beta Ga_\gamma O_\delta$ ($2.9 \leq \alpha \leq 3.1$, $0.48 \leq \beta \leq 0.52$, $5.4 \leq \gamma \leq 5.6$ and $13.8 \leq \delta \leq 4.2$) and a single crystal may contain one or more unavoidable impurities among Al, Zr, Fe, Ce, Nd, Pt and Ca.

What is claimed is:

1. A surface acoustic wave device comprising a substrate and an inter-digital electrode having a finger on a surface of said substrate, wherein:
   the substrate is formed by cutting out of a single crystal represented by a chemical formula, $La\alpha Ta\beta Ga\gamma O\delta$ ($2.9 \leq \alpha \leq 3.1$, $0.48 \leq \beta \leq 0.52$, $5.4 \leq \gamma 5.6$ and $13.8 \leq \delta 14.2$);
   a cut angle of the substrate cut out of the single crystal and a direction of propagation of surface acoustic waves on die substrate represented in terms of Euler's angles ($\phi$, $\theta$, $\psi$), $\phi$, $\theta$ and $\psi$ are found in one of a first area represented by −5 degrees $\leq \phi \leq 5$ degrees, 135 degrees $\leq \theta \leq 150$ degrees and 20 degrees $< \psi < 25$ degrees and a second area represented by 5 degrees $\leq \phi \leq 5$ degrees, 135 degrees $\leq \theta \leq 150$ degrees and −25 degrees $< \psi < -20$ degrees, respectively, and
   a ratio obtained by dividing a thickness h of the finger of the inter-digital electrode by a wavelength $\lambda$ of the surface acoustic wave, such that the ratio h/$\lambda$ exceeds 0.5% and is equal to or smaller than 4%.

2. A surface acoustic wave device in accordance with claim 1 wherein the substrate is formed by cutting out of a single crystal represented by a chemical formula, $La_3Ta_{0.5}Ga_{5.5}O_{14}$.

3. A surface acoustic wave device in accordance with claim 1 wherein $\phi$ in the second area ranges from −23.5 degrees to −20.5 degrees.

4. A surface acoustic wave device in accordance with claim 2 wherein $\phi$ in the second area ranges from −23.5 degrees to −20.5 degrees.

5. A surface acoustic wave device in accordance with claim 1 wherein $\phi$ in the second area ranges from −23.5 degrees to −20.5 degrees.

6. A surface acoustic wave device in accordance with claim 2 wherein $\phi$ in the second area ranges from −23.5 degrees to −20.5 degrees.

7. A surface acoustic wave device in accordance with claim 3 wherein $\phi$ in the second area ranges from −23.5 degrees to −20.5 degrees.

8. A surface acoustic wave device in accordance with claim 4 wherein $\phi$ in the second area ranges from −23.5 degrees to −20.5 degrees.

9. A surface acoustic wave device in accordance with claim 1 wherein the normalized thickness h/$\lambda$ ranges from 0.7% to 2%.

10. A surface acoustic wave device in accordance with claim 2 wherein the normalized thickness h/$\lambda$ ranges from 0.7% to 2%.

11. A surface acoustic wave device in accordance with claim 3 wherein the normalized thickness h/$\lambda$ ranges from 0.7% to 2%.

12. A surface acoustic wave device in accordance with claim 4 wherein the normalized thickness h/$\lambda$ ranges from 0.7% to 2%.

13. A surface acoustic wave device in accordance with claim 5 wherein the normalized thickness h/$\lambda$ ranges from 0.7% to 2%.

14. A surface acoustic wave device in accordance with claim 6 wherein the normalized thickness h/$\lambda$ ranges from 0.7% to 2%.

15. A surface acoustic wave device in accordance with claim 7 wherein the normalized thickness h/$\lambda$ ranges from 0.7% to 2%.

16. A surface acoustic wave device in accordance with claim 8 wherein the normalized thickness h/$\lambda$ ranges from 0.7% to 2%.

17. A surface acoustic wave device in accordance with claim 1 wherein the single crystal contains one or more impurities selected from a group consisting of Al, Zr, Fe, Ce, Nd, Pt and Ca.

18. A surface acoustic wave device in accordance with claim 2 wherein the single crystal contains one or more impurities selected from a group consisting of Al, Zr, Fe, Ce, Nd, Pt and Ca.

19. A surface acoustic wave device in accordance with claim 3 wherein the single crystal contains one or more impurities selected from a group consisting of Al, Zr, Fe, Ce, Nd, Pt and Ca.

20. A surface acoustic wave device in accordance with claim 4 wherein the single crystal contains one or more impurities selected from a group consisting of Al, Zr, Fe, Ce, Nd, Pt and Ca.

21. A surface acoustic wave device in accordance with claim 5 wherein the single crystal contains one or more impurities selected from a group consisting of Al, Zr, Fe, Ce, Nd, Pt and Ca.

22. A surface acoustic wave device in accordance with claim 6 wherein the single crystal contains one or more impurities selected from a group consisting of Al, Zr, Fe, Ce, Nd, Pt and Ca.

23. A surface acoustic wave device in accordance with claim 7 wherein the single crystal contains one or more impurities selected from a group consisting of Al, Zr, Fe, Ce, Nd, Pt and Ca.

24. A surface acoustic wave device in accordance with claim 8 wherein the single crystal contains one or more impurities selected from a group consisting of Al, Zr, Fe, Ce, Nd, Pt and Ca.

25. A surface acoustic wave device in accordance with claim 9 wherein the single crystal contains one or more impurities selected from a group consisting of Al, Zr, Fe, Ce, Nd, Pt and Ca.

26. A surface acoustic wave device in accordance with claim 10 wherein the single crystal contains one or more impurities selected from a group consisting of Al, Zr, Fe, Ce, Nd, Pt and Ca.

27. A surface acoustic wave device in accordance with claim 11 wherein the single crystal contains one or more impurities selected from a group consisting of Al, Zr, Fe, Ce, Nd, Pt and Ca.

28. A surface acoustic wave device in accordance with claim 12 wherein the single crystal contains one or more impurities selected from a group consisting of Al, Zr, Fe, Ce, Nd, Pt and Ca.

29. A surface acoustic wave device in accordance with claim 13 wherein the single crystal contains one or more impurities selected from a group consisting of Al, Zr, Fe, Ce, Nd, Pt and Ca.

30. A surface acoustic wave device in accordance with claim 14 wherein the single crystal contains one or more impurities selected from a group consisting of Al, Zr, Fe, Ce, Nd, Pt and Ca.

31. A surface acoustic wave device in accordance with claim 15 wherein the single crystal contains one or more impurities selected from a group consisting of Al, Zr, Fe, Ce, Nd, Pt and Ca.

32. A surface acoustic wave device in accordance with claim 16 wherein the single crystal contains one or more impurities selected from a group consisting of Al, Zr, Fe, Ce, Nd, Pt and Ca.

* * * * *

UNITED STATES PATENT AND TRADEMARK OFFICE
CERTIFICATE OF CORRECTION

PATENT NO.   : 6,429,570 B1                                                                                 Page 1 of 1
DATED        : August 6, 2002
INVENTOR(S)  : Kenji Inoue et al.

It is certified that error appears in the above-identified patent and that said Letters Patent is hereby corrected as shown below:

<u>Column 9,</u>
Line 28, after the symbol "γ" insert the symbol -- ≤ --.
Line 29, after the symbol "δ" insert the symbol -- ≤ --.
Line 32, change the word "die" to read -- the --.
Line 36, change the word "by 5 degrees" to read -- by –5 degrees --.

Signed and Sealed this

Twenty-third Day of December, 2003

JAMES E. ROGAN
*Director of the United States Patent and Trademark Office*